United States Patent [19]

Sanders et al.

[11] Patent Number: 4,631,539
[45] Date of Patent: Dec. 23, 1986

[54] DIGITAL POINTER POSITION DETECTOR

[75] Inventors: Gary G. Sanders, Lakewood; Michael E. Corwon, Parma, both of Ohio

[73] Assignee: The Scott & Fetzer Company, Cleveland, Ohio

[21] Appl. No.: 459,262

[22] Filed: Jan. 19, 1983

[51] Int. Cl.⁴ .......... G08C 9/06; G08C 19/36
[52] U.S. Cl. .......... 340/870.29; 250/231 SE; 340/347 P; 340/870.02
[58] Field of Search .......... 340/347 P, 870.02, 870.03, 340/870.29, 870.31, 870.32; 250/231 SE, 354.1; 455/615, 618

[56] References Cited

U.S. PATENT DOCUMENTS

| | | | |
|---|---|---|---|
| 2,978,693 | 4/1961 | Champion | 340/870.29 |
| 3,201,779 | 8/1965 | Emmerich | 340/347 P |
| 3,766,544 | 10/1973 | Batz | 340/347 P |
| 3,815,126 | 6/1974 | Batz | 250/231 SE |
| 4,074,128 | 2/1978 | Harris | 250/231 SE |
| 4,101,882 | 7/1978 | Kramer | 250/231 SE |
| 4,137,451 | 1/1979 | Einolf | 250/231 SE |
| 4,212,000 | 7/1980 | Yamada | 340/347 P |
| 4,327,362 | 4/1982 | Hoss | 250/231 SE |
| 4,334,222 | 6/1982 | Kelley | 250/231 SE |
| 4,412,206 | 10/1983 | Schwefel | 340/347 P |

Primary Examiner—John W. Caldwell, Sr.
Assistant Examiner—Michael F. Heim
Attorney, Agent, or Firm—Pearne, Gordon, Sessions, McCoy, Granger & Tilberry

[57] ABSTRACT

A mechanical dial indicating gauge or meter that, without mechanical loading, optoelectronically detects and encodes the pointer position as a digital signal by use of a technique of distributed point position latching. Counter means drives a circuit which cylically sequentially lights LED's along a scale and the count is latched that corresponds to current counter position when a detector on the scale pointer is activated during the sequential lighting. This latched count provides the digital signal of pointer position. This digital signal may then by transmitted to remote indicators, controllers, computers, and/or may be compared to preset values yielding set point outputs. An electrical lead for the detector includes a spiral loosely surrounding the pointer stem.

11 Claims, 7 Drawing Figures

4,631,539

DIGITAL POINTER POSITION DETECTOR

This invention relates to an indicating gauge or meter, and particularly to a gauge or meter with an indicator pointer whose position is signalled independently of mechanical loading of the pointer or associated pointer linkage.

BACKGROUND OF THE INVENTION

Presently, alarm and on-off control functions are accomplished through the use of cam-operated snap action switches, or magnetically via mercury switches. Switching functions also have been accomplished optically with an incandescent light source with individual photodetector set points. In one such gauge, relays are activated when the photodetectors are shielded from the light source by an opaque ribbon which is mechanically pulled by the pointer mechanism.

The operation of all of the above devices is such as to tend to distort the accuracy of the gauge or meter due to a relatively high degree of mechanical loading of the pointer drive mechanism. Another disadvantage is that only a limited number of points may be used on a given gauge.

SUMMARY OF THE INVENTION

The present invention provides a gauge or meter in which the pointer position is optoelectronically detected and encoded as a digital signal. Counter means drives a circuit which cyclically sequentially lights light-emitting diodes (LED's) along a scale, and the count is latched that corresponds to current counter position when a detector on the scale pointer is actuated during the sequential lighting. The labeled count provides the digital signal of pointer positioning. At least one of the electrical leads for the detector on the scale pointer includes a spiral wire loosely surrounding the pointer stem, so that the bending load imposed on the wire when the pointer moves is negligibly low, as is the corresponding torsional mechanical loading of the pointer.

DETAILED DESCRIPTION OF THE DRAWINGS

Figure 7:
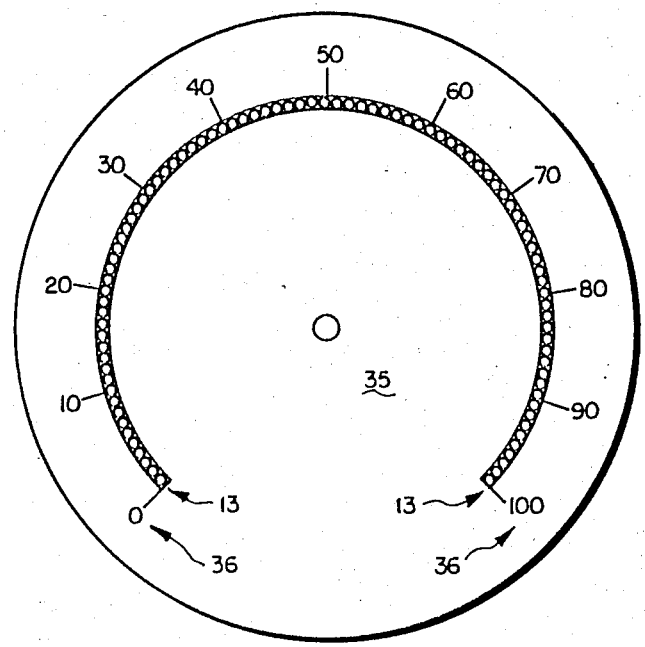
FIG. 7 is a front view of a dial face drawn roughly to scale and showing an array of 100 LED's.
Figure 6:
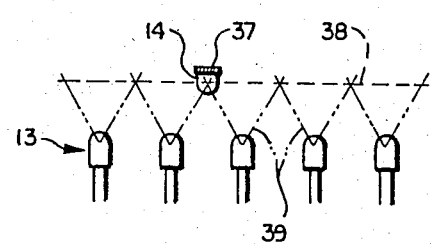
FIG. 6 is a diagrammatic illustration of the geometrical relationship between the photodetector carried on the pointer and the dispersion angles of the LED's.

A pointer 37 (FIGS. 3–6) carrying a photodetector 14 (FIGS. 1–6) moves along a dial indicator scale 36 (FIG. 7) so that the photodetector sweeps over an array 13 (FIGS. 1–3, 6, 7) of LED's. The LED's are arranged in an arc for circular dials such as that shown, and linearly for edge reading dials. The photodetector 14 sweeps an arc (or line) on the plane 38 (FIG. 6) where the dispersion angles 39 (FIG. 6) of the LED's intersect.

Figure 1:
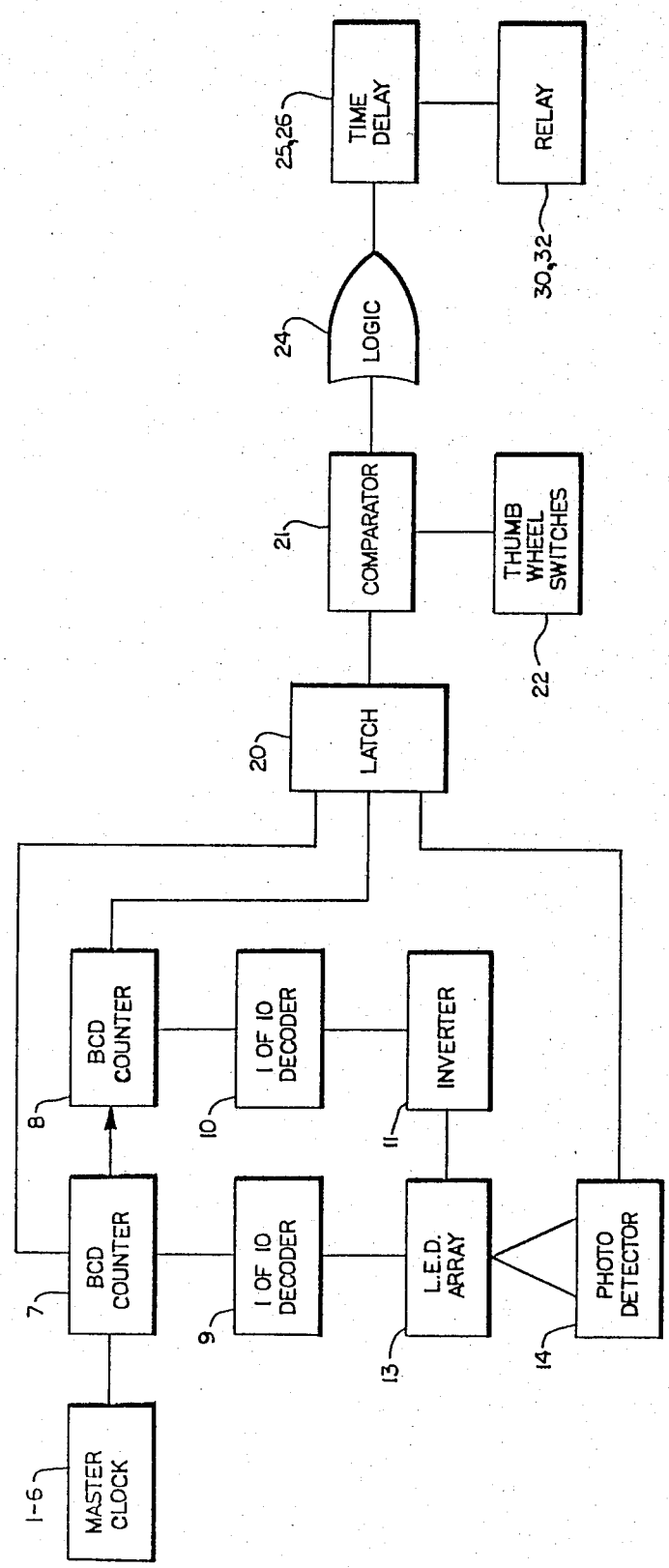
FIG. 1 is a flow chart illustrating the operation of the invention. Single elements in FIG. 1 that correspond to separately numbered elements in the other Figures are labeled with the various separate element numbers.
Figure 2:
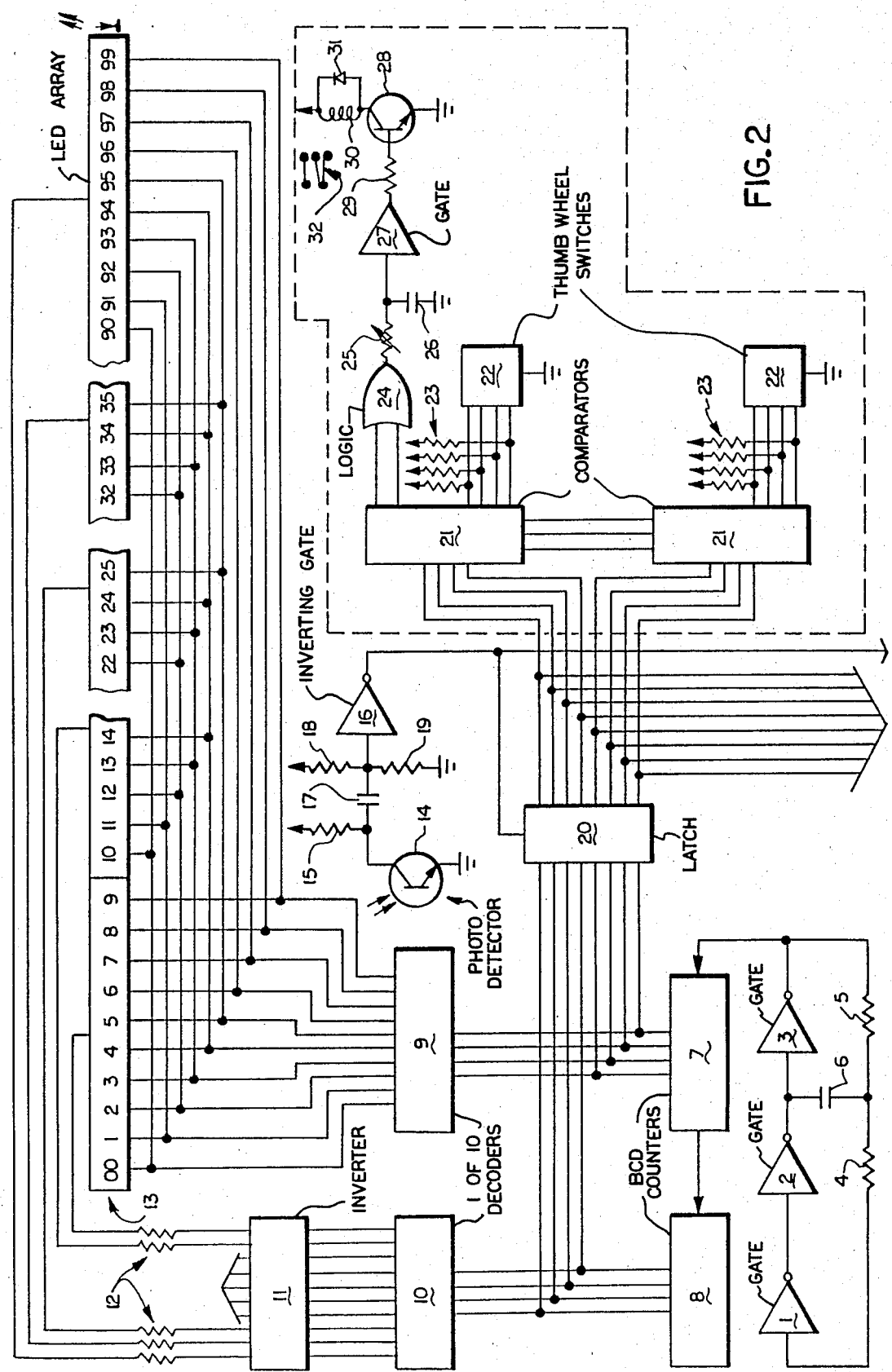
FIG. 2 is a schematic circuit diagram illustrating an embodiment of the invention.
Figure 3:
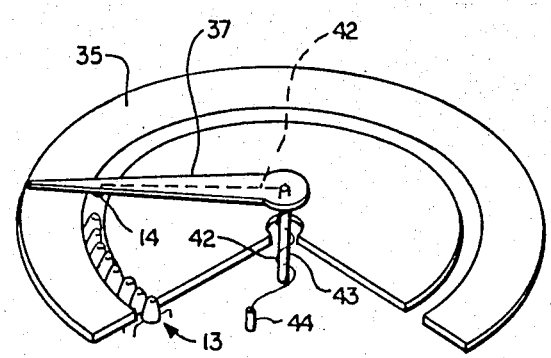
FIG. 3 is an isometric view, partly cut away, illustrating a dial and LED array, the scale of the LED's being exaggerated for clarity.
Figure 5:
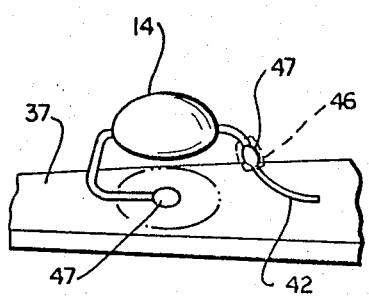
FIG. 5 shows a portion of FIG. 4 in still greater detail.

As indicated in FIG. 1, the LED's are sequentially lighted by cross-point multiplexing the outputs of 1 of N decoders (1 of 10 in the illustrated embodiment) driven by digital BCD counters 7,8 (FIGS. 1,2). Thus, each LED will be lighted only when its unique address is present in the counters.

When the LED being lighted is beneath the photodetector, a pulse is generated that latches its address into an output buffer. This address is presented as parallel BCD code representing the position and is generated along with a data available signal.

The address latched in the output buffer may be used directly for sensing, monitoring, or control functions, or may be compared with a number that is preset by thumbwheel switches and the compared output signal used as a set point indication or as an activation such as causing relay closure, etc.

More specifically, in the illustrated embodiment a 100 position LED array is used. Inverting gates 1, 2, and 3 are connected as a ring oscillator with timing component resistors 4,5 and capacitor 6. This is the system clock and drives a ripple cascaded 2 digit BCD counter 7, 8. The unit digit counter 7 drives a negative true 1 of 10 decoder 9. The tens digit counter 8 drives a similar decoder 10 whose output is inverted and buffered by gates 11. These two signals supply the drive current for the LED array 13 with resistors 12 in series as current limiters. The LED's are cross-point multiplexed, with the tens counter 10 enabling a decade at a time, and the units counter enabling all like unit LED's simultaneously (e.g., 1, 11, 21, 31, 41, etc.). Thus, only one LED has both a current source and sink path applied to it at a given time so that it is capable of lighting.

The photodetector 14 (phototransistor with a monochromatic filter, not separately shown) is connected in a common emitter configuration and has resistor 15 as its collector load. When a light pulse from an LED is optically coupled to its base, the voltage at the collector falls. This falling edge (pulse) is coupled to inverting gate 16 through capacitor 17, with resistors 18 and 19 providing a bias level at the inverter's input. This ac coupling method is used to reduce the effects of ambient light on the sensor and is possible because the desired output is the rapid dV/dt such as that caused by the pulsed lighting of the LED's and not the relatively slow dV/dt changes due to ambient variations. The pulse, after being squared by inverter 16, becomes the data available ($\overline{DAV}$) output as well as the update signal of the output latch 20, which then holds the BCD address present at the time the update pulse arrives.

The circuiting for one set point is described, although any number up to the number of the LED's may be used by simply replicating the circuit.

Two 4-bit comparators 21 are cascaded for a two-digit BCD compare. The compared inputs are (1) the BCD digits set on thumbwheel BCD switches 22 with pull-up resistors 23 vs. (2) the latched BCD address which indicates the pointer's current position. The intrinsic outputs of the cascaded comprators 21 (i.e., equal to, less than, or greater than) may be buffered or combined in the OR gate 24 yielding any one of the following outputs: less than, less than or equal to, equal to, greater than or equal to, greater than, or not equal to.

Such OR gate, together with the comparators proper, may broadly be considered to constitute comparator means. This output is delayed by the RC time constant created by resistor 25 and capacitor 26, then buffered and squared by gate 27. This delay is necessary as dampening because pointer oscillations around a set point would cause rapid on-off switching, an undesirable characteristic. The resistor 25 is preferably variable, as shown, to provide an adjustable delay to vary the degree of dampening. The buffer 27 provides base drive for transistor switch 28, with resistor 29 limiting base current. The transistor 28 is connected in common emitter configuration with its collector load being a relay coil 30 for relay switch 32. Diode 31 is a freewheeling diode to limit inductive spikes generated by the relay coil.

As indicated in FIG. 2, parallel 2 digit BCD output from latch 20 and the data available ($\overline{DAV}$) signal may be provided independently of comparators 21. This may be utilized directly for sensing, monitoring, and/or control functions. The parallel 2 digit BCD output and $\overline{DAV}$ signal provide a logic level directly compatible with computers and/or process controllers. In such arrangements a computer or process controller may take various actions based on gauged values, or on sequences or combinations of gauged values, and/or may initiate or change set points, and/or perform other functions dependent on the output of the illustrated device. Such output can be used to control a remote display, and/or in conjunction with a look-up table ROM for data conversion to follow or reflect any known linearity, slope, or offset.

Figure 4:
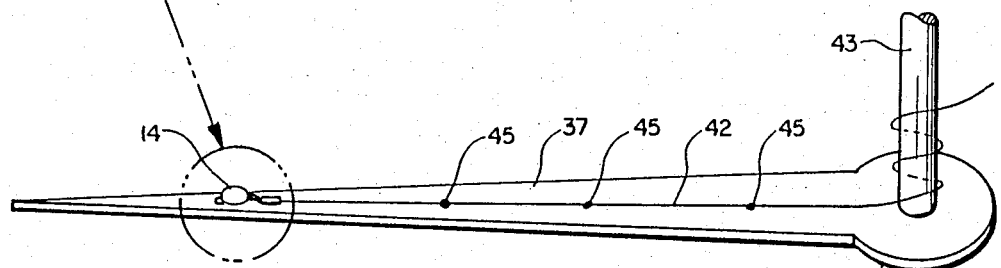
FIG. 4 is an inverted, more detailed illustration of the dial pointer.

One advantage of the invention is the reduction of signal distortion caused by torsional mechanical loading of the pointer or associated pointer linkage to a much lower value than the prior art. To this end, the insulated power lead wire 42 (FIGS. 3-5) is wrapped as a loose spiral around the pointer stem 43 (FIGS. 3,4) and extends from a fixed sleeve 44 (FIG. 3) or other fixed mount associated with the body of the gauge or meter around the spiral to the inner end of the pointer and then along the pointer to the photodetector 14. The lead 42 is chosen for low mechanical resistance to bending and may comprise phono-cartridge wire insulated by a thermoplastic jacket. The lead 42 may be fixed to the pointer at intervals by adhesive 45 (FIG. 4). The outer end of the lead 42 may be soldered to one lead of the photodetector 14 and the other lead of the photodetector may be soldered to the pointer at the solder joints 47 seen in FIG. 5. Shrink tubing 46 (FIG. 5) may cover the first of these joints. The pointer 37 and stem 43 may be metal so as to constitute the second power lead for the photodetector 14. The bending load imposed on the loosely spirally wrapped single wire lead 42 is so low as to be negligible, as is the corresponding torsional mechanical loading of the pointer. It is believed that even the use of two wire leads each similarly arranged would result in negligible torsional loading, but the use of a single wire lead as described is preferred.

In dim or dark surroundings, the LED's may appear to the eye to be continuously lit in a glowing arc or line which throws the pointer into sharp relief for easy viewing, thereby providing efficient and effective dial illumination that is novel and aesthetically appealing.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. An indicating gauge or meter of the scalar dial type with an indicator pointer whose position may be signalled with acceptable resolution and with negligible torsional mechanical loading of the pointer or associated pointer linkage, said indicating gauge comprising: said pointer, an arcuate or linear indicator scale along which said pointer moves, an array of LED's arranged along said scale and each having its own unique address, said array of LED's being of a high linear density corresponding to acceptable resolution for indicator scale readings, a photodetector mounted as a unitary part of said indicator pointer to sweep as a part of the pointer itself back and forth in both directions over said high density array of LED's according to the movements of said pointer, means for cyclically sequentially lighting the LED's for single point transmission independently of said pointer's position and correspondingly counting through the addresses of LED's being lighted, on a one-to-one basis of single point activation to instantaneously-current count, whereby each said LED in said high-linear density single point transmission array is lighted only for the instant that its unique address is the instantaneously-current count, buffer means responsive to activation of said photodetector for latching the count corresponding to the pointer's then-obtained position as the sequential lighting of the LED's cycles to or past the photodetector whereby the then-obtained position of said pointer defines the value of said latched count and the defined value of the latched count identifies pointer position with a degree of resolution acceptable for indicator gauge readings.

2. A device as in claim 1, set point means for setting a discrete set point corresponding to any one of the addresses of the LED's, and comparator means for signalling whether the latched count corresponding to the pointer's then-obtained position compares to the set point value in at least one of the following ways: less than, less than or equal to, equal to, greater than or equal to, greater than, or unequal to the set point value.

3. A device as in claim 1, in which said LED's arranged along said scale emit photodetector-stimulating light at a given dispersion angle and said pointer-mounted photodetector moves through the intersections of the rays of the dispersion angles of each adjacent pair of LED's as said photodetector sweeps over said array of LED's.

4. A device as in claim 2, output delay means including RC time constant means for delaying the signal from said comparator means to thereby dampen pointer oscillations around a set point.

5. A device as in claim 4, said output delay means being adjustable for varying the degree of dampening.

6. A device as in claim 1, said pointer being mounted on a stem and turning on the axis of the stem to cause the sweeping of the photodetector over the corresponding array of LED's, and a pair of electrical leads joining the photodetector to the remainder of the circuitry of the device.

7. An indicating gauge or meter with an indicator pointer whose position may be signalled with negligible torsional mechanical loading of the pointer or associated pointer linkage, said indicating gauge comprising: said pointer, an arcuate or linear indicator scale along which said pointer moves, an array of LED's arranged along said scale and each having its own unique address, a photodetector mounted on said indicator pointer to sweep back and forth over said array of LED's according to the movements of said pointer, means for cyclically sequentially lighting the LED's independently of said pointer's position and correspondingly counting through the addresses of LED's being lighted whereby each LED is lighted only for the instant that its unique address is the instantaneously-current count, buffer means responsive to activation of said photodetector for latching the count corresponding to the pointer's then-obtained position as the sequential lighting of the LED's cycles past the photodetector whereby the then-obtained position of said pointer defines the value of said latched count said pointer being mounted on a stem and turning on the axis of the stem to cause the sweeping of the photodetector over the corresponding array of LED's, and a pair of electrical leads joining the photodetector to the remainder of the circuitry of the device, at least one of said leads comprising at least in part a wire formed as a spiral extending along the stem from said pointer toward the base of the stem, the spiral loosely surrounding the stem.

8. An indicating gauge or meter with an indicator pointer whose position may be signalled with negligible torsional mechanical loading of the pointer or associated pointer linkage, said indicating gauge comprising: said pointer, an arcuate or linear indicator scale along which said pointer moves, an array of LED's arranged along said scale and each having its own unique address, a photodetector mounted on said indicator pointer to sweep over said array of LED's, means for cyclically sequentially lighting the LED's and correspondingly counting through the addresses of LED's being lighted whereby each LED is lighted only for the instant that its unique address is the instantaneously-current count, buffer means responsive to activation of said photodetector for latching the count corresponding to the pointer's then-obtained position as the sequential lighting of the LED's cycles past the photodetector whereby the then-obtained position of said pointer defines the value of said latched count, said pointer being mounted on a stem and turning on the axis of the stem to cause the sweeping of the photodetector over the corresponding array of LED's, and a pair of electrical leads joining the photodetector to the remainder of the circuitry of the device, said pointer being made of electrically conductive material, at least one of said leads comprising at least in part said pointer itself.

9. An indicating gauge or meter with an indicator pointer whose position may be signalled with negligible torsional mechanical loading of the pointer or associated pointer linkage, said indicating gauge comprising: said pointer, an arcuate or linear indicator scale along which said pointer moves, an array of LED's arranged along said scale and each having its own unique address, a photodetector mounted on said indicator pointer to sweep over said array of LED's, means for cyclically sequentially lighting the LED's and correspondingly counting through the addresses of LED's being lighted whereby each LED is lighted only for the instant that its unique address is the instantaneously-current count, buffer means responsive to activation of said photodetector for latching the count corresponding to the pointer's then-obtained position as the sequential lighting of the LED's cycles past the photodetector whereby the then-obtained position of said pointer defines the value of said latched count, said pointer being mounted on a stem and turning on the axis of the stem to cause the sweeping of the photodetector over the corresponding array of LED's, and a pair of electrical leads joining the photodetector to the remainder of the circuitry of the device, said pointer and stem being made of electrically conductive material, one of said leads comprising in part a wire formed as a spiral loosely surrounding and extending along the stem from said pointer toward the base of the stem, the other of said leads comprising in part the stem itself, and one of said leads comprising in part the pointer itself.

10. An indicating gauge or meter with an indicator pointer whose position is signalled with negligible torsional mechanical loading of the pointer or associated pointer linkage, said indicating gauge comprising: said pointer, an arcuate or linear indicator scale along which said pointer moves, photoelectronic sensing and signalling means for detecting and signalling the position of the pointer, said means including an electronic circuit with an array of fixed circuit elements arranged along said scale and a moving circuit element carried on said pointer to sweep over said array, said pointer being mounted on a stem and turning on the axis of the stem to cause said sweeping, a pair of electrical leads joining the moving circuit element to the remainder of the electronic circuit, at least one of said leads comprising in part a wire formed as a sprial loosely surrounding and extending along the stem from the pointer toward the base of the stem.

11. An indicating gauge or meter with an indicator pointer whose position is signalled with negligible torsional mechanical loading of the pointer or associated pointer linkage, said indicating gauge comprising: said pointer, an arcuate or linear indicator scale along which said pointer moves, photoelectronic sensing and signalling means for detecting and signalling the position of the pointer, said means including an electronic circuit with an array of fixed circuit elements arranged along said scale and a moving circuit element carried on said pointer to sweep over said array, said pointer being mounted on a stem and turning on the axis of the stem to cause said sweeping, a pair of electrical leads joining the moving circuit element to the remainder of the electronic circuit, at least one of said leads comrprising in part a wire formed as a sprial loosely surrounding and extending along the stem from the pointer toward the base of the stem, the other of said leads comprising in part the stem itself, and one of said leads comprising in part the pointer itself.

* * * * *